(12) United States Patent
Koshimizu

(10) Patent No.: US 12,125,672 B2
(45) Date of Patent: Oct. 22, 2024

(54) PLASMA PROCESSING METHOD AND PLASMA PROCESSING APPARATUS

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/350,207

(22) Filed: Jul. 11, 2023

(65) Prior Publication Data
US 2023/0360882 A1 Nov. 9, 2023

Related U.S. Application Data

(63) Continuation of application No. 16/919,650, filed on Jul. 2, 2020, now Pat. No. 11,742,180.

(30) Foreign Application Priority Data

Jul. 16, 2019 (JP) .................................. 2019-130978

(51) Int. Cl.
*H01L 21/00* (2006.01)
*H01J 37/248* (2006.01)
*H01J 37/32* (2006.01)

(52) U.S. Cl.
CPC ...... *H01J 37/32082* (2013.01); *H01J 37/248* (2013.01); *H01J 37/32568* (2013.01)

(58) Field of Classification Search
None
See application file for complete search history.

(56) References Cited

U.S. PATENT DOCUMENTS

| 11,201,034 | B2 * | 12/2021 | Hisatomi | .......... H01J 37/32009 |
| 2005/0103275 | A1 | 5/2005 | Sasaki et al. | |
| 2007/0111339 | A1 | 5/2007 | Wege et al. | |
| 2007/0224709 | A1 | 9/2007 | Ogasawara | |
| 2008/0180357 | A1 | 7/2008 | Kawakami et al. | |
| 2009/0242127 | A1 | 10/2009 | Koshimizu et al. | |
| 2010/0304572 | A1 | 12/2010 | Koshimizu | |
| 2012/0175063 | A1 | 7/2012 | Yamawaku et al. | |
| 2015/0325413 | A1 | 11/2015 | Kim et al. | |
| 2019/0295825 | A1 | 9/2019 | Tsujimoto et al. | |
| 2020/0118794 | A1 * | 4/2020 | Koshimizu | ....... H01J 37/32027 |
| 2020/0135527 | A1 | 4/2020 | Sung et al. | |

(Continued)

FOREIGN PATENT DOCUMENTS

JP 2003-297810 A 10/2003
JP 2007-250967 A 9/2007

(Continued)

*Primary Examiner* — Sylvia MacArthur
*Assistant Examiner* — Michelle Crowell
(74) *Attorney, Agent, or Firm* — Studebaker & Brackett PC

(57) ABSTRACT

A plasma processing method according to an exemplary embodiment includes preparing a substrate in a chamber of a plasma processing apparatus. The substrate is disposed on a substrate support in the chamber. The substrate support includes a lower electrode and an electrostatic chuck. The electrostatic chuck is provided on the lower electrode. The plasma processing method further includes applying a positive voltage to a conductive member when plasma is being generated in the chamber for plasma processing on the substrate. The conductive member extends closer to a grounded side wall of the chamber than the substrate.

12 Claims, 14 Drawing Sheets

(56) References Cited

U.S. PATENT DOCUMENTS

| | | |
|---|---|---|
| 2020/0161102 A1 | 5/2020 | Liao |
| 2020/0185193 A1* | 6/2020 | Koshimizu ....... H01J 37/32577 |
| 2020/0203115 A1 | 6/2020 | Koo |
| 2020/0219706 A1* | 7/2020 | Koshimizu ....... H01J 37/32174 |
| 2020/0227326 A1* | 7/2020 | Oikawa ............. H01J 37/32091 |

FOREIGN PATENT DOCUMENTS

| | | |
|---|---|---|
| TW | I373798 B | 10/2012 |
| TW | I435406 B | 4/2014 |
| TW | 201908523 A | 3/2019 |
| WO | 2008/005756 A2 | 1/2008 |

\* cited by examiner

PLASMA PROCESSING METHOD AND PLASMA PROCESSING APPARATUS

CROSS-REFERENCE TO RELATED APPLICATIONS

This application is a Continuation of U.S. patent application Ser. No. 16/919,650 filed Jul. 2, 2020, which claims benefit of priority to Japanese Patent Application No. 2019-130978 filed on Jul. 16, 2019, the entire contents of which are incorporated herein by reference.

TECHNICAL FIELD

Exemplary embodiments of the present disclosure relate to a plasma processing method and a plasma processing apparatus.

BACKGROUND

Plasma processing on a substrate is performed using a plasma processing apparatus. A plasma processing apparatus disclosed in Japanese Patent Application Laid-Open Publication No. 2003-297810 (hereinafter referred to as a "Patent Literature 1") is known as one type of a plasma processing apparatus. The plasma processing apparatus disclosed in Patent Literature 1 is provided with a chamber, a lower electrode, and an upper electrode. The lower electrode is provided in the chamber. A substrate is placed on the lower electrode. The upper electrode is provided above the lower electrode. In the plasma processing apparatus disclosed in Patent Literature 1, the upper electrode has a dome shape in order to make plasma density uniform.

SUMMARY

In an exemplary embodiment, a plasma processing method is provided. The plasma processing method includes preparing a substrate in a chamber of a plasma processing apparatus. The substrate is disposed on a substrate support in the chamber. The substrate support includes a lower electrode and an electrostatic chuck. The electrostatic chuck is provided on the lower electrode. The plasma processing method further includes applying a positive voltage to a conductive member when plasma is being generated in the chamber for plasma processing on the substrate. The conductive member extends closer to a grounded side wall of the chamber than the substrate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
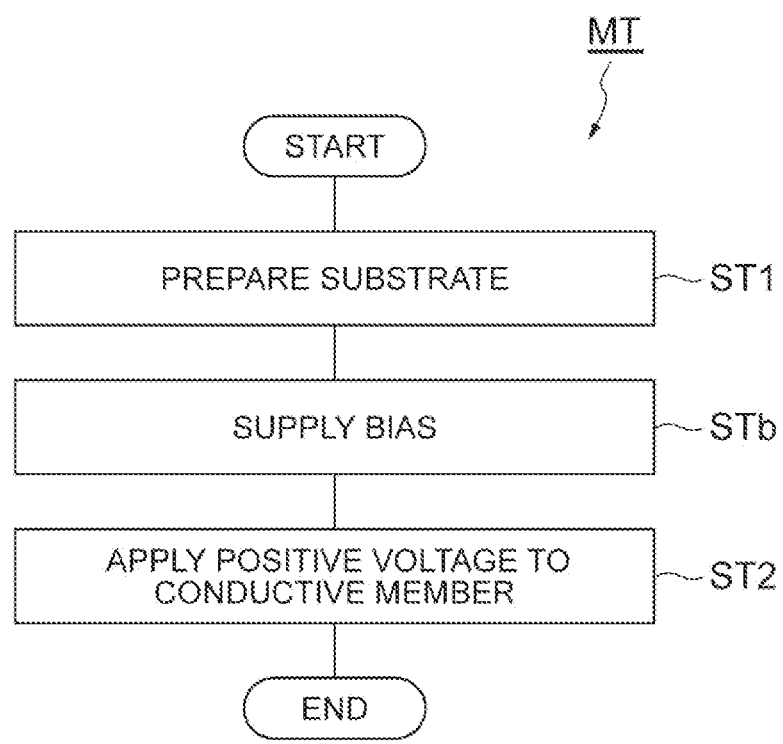
FIG. 1 is a flowchart of a plasma processing method according to an exemplary embodiment.

Hereinafter, various exemplary embodiments will be described.

In an exemplary embodiment, a plasma processing method is provided. The plasma processing method includes preparing a substrate in a chamber of a plasma processing apparatus. The substrate is disposed on a substrate support in the chamber. The substrate support includes a lower electrode and an electrostatic chuck. The electrostatic chuck is provided on the lower electrode. The plasma processing method further includes applying a positive voltage to a conductive member when plasma is being generated in the chamber for plasma processing on the substrate. The conductive member extends closer to a grounded side wall of the chamber than the substrate.

In the embodiment described above, the density of negative ions increases near the edge of the substrate by applying a positive voltage to the conductive member. The density of positive ions in plasma is represented by the sum of the density of negative ions and the density of electrons. Therefore, the density of positive ions near the edge of the substrate can be adjusted by applying a positive voltage to the conductive member.

In an exemplary embodiment, the substrate is disposed on the substrate support and in an area surrounded by an edge ring. The edge ring is the conductive member. The plasma processing method further includes supplying a bias to the lower electrode when plasma is being generated in the chamber for plasma processing on the substrate. The bias is radio frequency bias power, or a pulsed negative voltage which is periodically applied to the lower electrode. The positive voltage is applied to the edge ring in a period in which the potential of the substrate is equal to or greater than 0, and sets the potential of the edge ring to a potential higher than the potential of the substrate in the period.

In an exemplary embodiment, the substrate is disposed on the substrate support and in an area surrounded by an edge ring. The conductive member is electrically separated from the edge ring and extends closer to the side wall of the chamber than the edge ring. The plasma processing method further includes supplying a bias to the lower electrode when plasma is being generated in the chamber for plasma processing on the substrate. The bias is radio frequency bias power, or a pulsed negative voltage which is periodically applied to the lower electrode. The positive voltage is applied to the conductive member in a period in which the potential of the substrate is negative.

In an exemplary embodiment, the positive voltage may be applied to the conductive member even in the period in which the potential of the substrate is equal to or greater than 0.

In an exemplary embodiment, the positive voltage may be a direct-current voltage which is continuously applied to the conductive member in both the period in which the potential of the substrate is negative and the period in which the potential of the substrate is equal to or greater than 0.

In an exemplary embodiment, the positive voltage which is applied to the conductive member in the period in which the potential of the substrate is negative may be higher than the positive voltage which is applied to the conductive member in the period in which the period of the substrate is equal to or greater than 0.

In an exemplary embodiment, a positive voltage may be applied to the edge ring to set the potential of the edge ring to a potential higher than the potential of the substrate in the period in which the potential of the substrate is equal to or greater than 0.

In an exemplary embodiment, the plasma processing may be plasma etching on the substrate.

In another exemplary embodiment, a plasma processing apparatus is provided. The plasma processing apparatus includes a chamber, a substrate support, and a power source device. The substrate support is provided in the chamber. The substrate support includes a lower electrode and an electrostatic chuck. The electrostatic chuck is provided on the lower electrode. The power source device is configured to apply a positive voltage to a conductive member. The conductive member extends closer to a grounded side wall of the chamber than a substrate placed on the substrate support.

In an exemplary embodiment, the plasma processing apparatus further includes a bias power source. The bias power source is configured to supply a bias to the lower electrode when plasma is being generated in the chamber for plasma processing on the substrate. The bias is radio frequency bias power, or a pulsed negative voltage which is periodically applied to the lower electrode. The conductive member is an edge ring that extends to surround the substrate. The power source device is configured to apply a positive voltage to the edge ring in a period in which the potential of the substrate is equal to or greater than 0, and set the potential of the edge ring to a potential higher than the potential of the substrate in the period.

In an exemplary embodiment, the conductive member extends closer to the side wall of the chamber than an edge ring extending to surround a substrate placed on the substrate support. The plasma processing apparatus further includes a bias power source. The bias power source is configured to supply a bias to the lower electrode when plasma is being generated in the chamber for plasma processing on the substrate. The bias is radio frequency bias power, or a pulsed negative voltage which is periodically applied to the lower electrode. The power source device is configured to apply a positive voltage to the conductive member in the period in which the potential of the substrate is negative.

In an exemplary embodiment, the power source device may be configured to apply a positive voltage to the conductive member even in the period in which the potential of the substrate is equal to or greater than 0.

In an exemplary embodiment, the power source device may be configured to continuously apply a direct-current voltage as the positive voltage to the conductive member in both the period in which the potential of the substrate is negative and the period in which the potential of the substrate is equal to or greater than 0.

In an exemplary embodiment, the positive voltage which is applied to the conductive member in the period in which the potential of the substrate is negative may be higher than the positive voltage which is applied to the conductive member in the period in which the potential of the substrate is equal to or greater than 0.

In an exemplary embodiment, the plasma processing apparatus may further include an other power source device. The other power source device is configured to apply a positive voltage to the edge ring in the period in which the potential of the substrate is equal to or greater than 0, to set the potential of the edge ring to a potential higher than the potential of the substrate in the period in which the potential of the substrate is equal to or greater than 0.

Hereinafter, various exemplary embodiments will be described in detail with reference to the drawings. In the drawing, the same or equivalent portions are denoted by the same reference symbols.

FIG. 1 is a flowchart of a plasma processing method according to an exemplary embodiment. The plasma processing method (hereinafter referred to as a "method MT") shown in FIG. 1 is applied to a substrate. The plasma processing in the method MT is, for example, plasma etching on the substrate. The method MT includes step ST1 and step ST2. In an embodiment, the method MT may further include step STb.

In step ST1, a substrate is prepared in a chamber of a plasma processing apparatus. The substrate may have a disk shape. The substrate is disposed substantially horizontally on a substrate support in the chamber. In an embodiment, the substrate support includes a lower electrode and an electrostatic chuck. The electrostatic chuck is provided on the lower electrode. The substrate is held by the electrostatic chuck.

In the method MT, plasma is generated in the chamber in a state where the substrate is disposed in the chamber for plasma processing on the substrate. Step STb is executed when plasma is being generated in the chamber. In step STb, a bias is supplied to the lower electrode. The bias is radio frequency bias power, or a pulsed negative voltage which is periodically applied to the lower electrode.

Step ST2 is executed when plasma is being generated in the chamber. In step ST2, a positive voltage is applied to a conductive member. The conductive member extends closer to a grounded side wall of the chamber than the substrate.

A positive voltage is applied to the conductive member, whereby the density of negative ions increases near the edge of the substrate. The density of positive ions in plasma is represented by the sum of the density of negative ions and the density of electrons. Therefore, the density of positive ions near the edge of the substrate can be adjusted by applying a positive voltage to the conductive member.

Hereinafter, plasma processing apparatuses according to various exemplary embodiments, which can be used in the execution of the method MT, will be described. Further, step ST2 which is executed by using each of the plasma processing apparatuses according to various exemplary embodiments will also be described.

Figure 2:
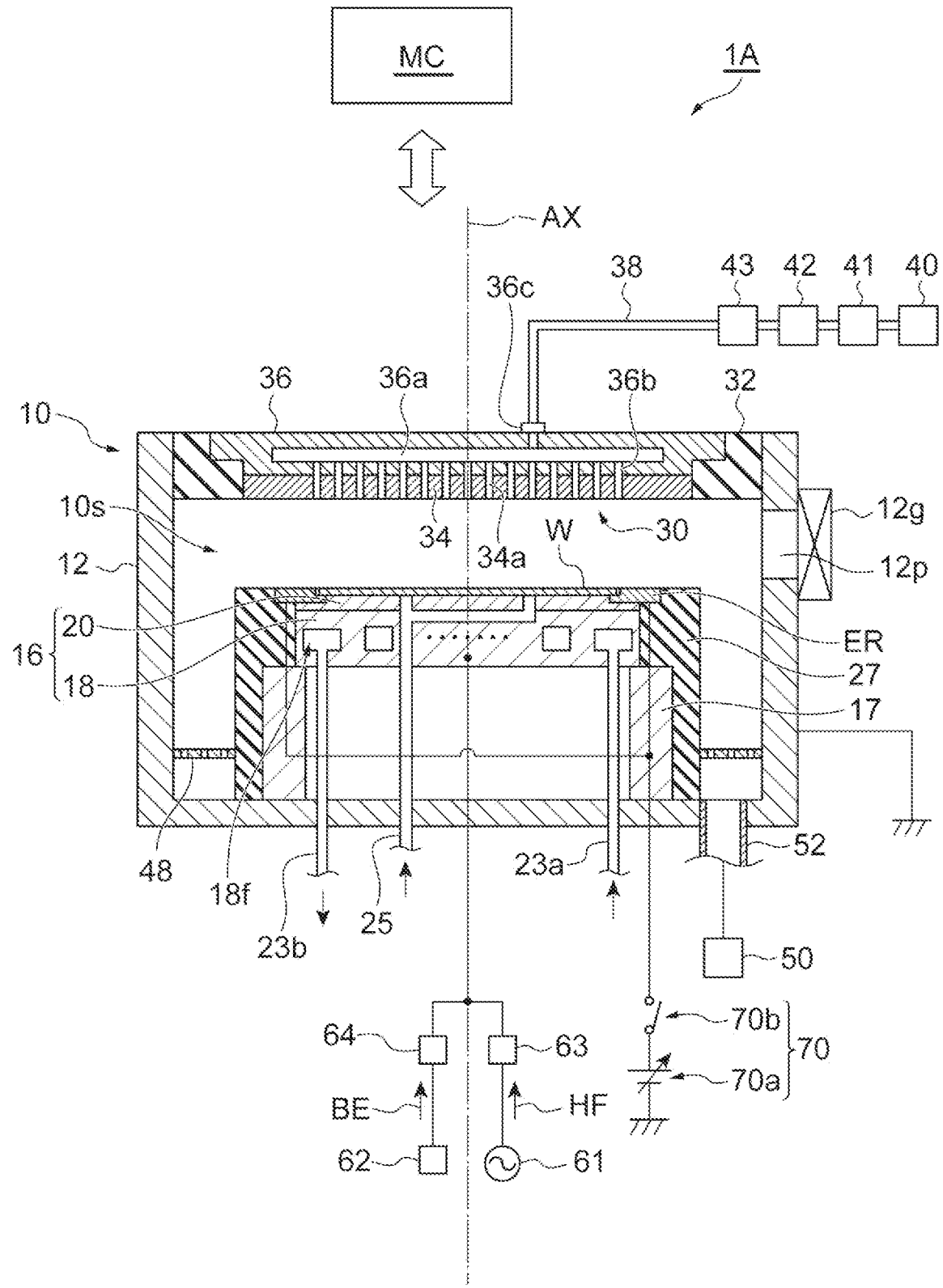
FIG. 2 is a diagram schematically showing a plasma processing apparatus according to an exemplary embodiment.

FIG. 2 is a diagram schematically showing a plasma processing apparatus according to an exemplary embodiment. A plasma processing apparatus 1A shown in FIG. 2 is a capacitively-coupled plasma processing apparatus. The plasma processing apparatus 1A is provided with a chamber 10. The chamber 10 provides an internal space 10s therein. The central axis of the internal space 10s is an axis AX extending in the vertical direction.

In an embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. That is, the chamber body 12 provides a grounded side wall of the chamber 10. A film having plasma resistance is formed on the inner wall surface of the chamber body 12, that is, the wall surface defining the internal space 10s. This film may be a ceramic film such as a film formed by anodization or a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 in order to open and close the passage 12p.

The plasma processing apparatus 1A further includes a substrate support 16. The substrate support 16 is configured to support the substrate W placed thereon in the chamber 10. The substrate W has a substantially disk shape. The substrate support 16 is supported by a support 17. The support 17 extends upward from a bottom portion of the chamber 10. The support 17 has a substantially cylindrical shape. The support 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, a liquid refrigerant or a refrigerant (for example, Freon) that cools the lower electrode 18 by vaporization thereof is used. A heat exchange medium supply device (for example, a chiller unit) is connected to the flow path 18f. This supply device is provided outside the chamber 10. The heat exchange medium is supplied to the flow path 18f from the supply device through a pipe 23a. The heat exchange medium supplied to the flow path 18f is returned to the supply device through a pipe 23b.

The electrostatic chuck 20 is provided on the lower electrode 18. When the substrate W is processed in the internal space 10s, the substrate W is placed on the electrostatic chuck 20 and is held by the electrostatic chuck 20.

The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX. The electrode of the electrostatic chuck 20 is provided in the main body. The electrode of the electrostatic chuck 20 has a film shape. A direct-current power source is electrically connected to the electrode of the electrostatic chuck 20 through a switch. When the voltage from the direct-current power source is applied to the electrodes of the electrostatic chuck 20, an electrostatic attraction force is generated between the electrostatic chuck 20 and the substrate W. Due to the generated electrostatic attraction force, the substrate W is attracted to and held by the electrostatic chuck 20.

The electrostatic chuck 20 includes a substrate placing area. The substrate placing area is an area having a substantially disk shape. The central axis of the substrate placing area substantially coincides with the axis AX. When the substrate W is processed in the chamber 10, the substrate W is placed on the substrate placing area.

In an embodiment, the electrostatic chuck 20 may further include an edge ring placing area. The edge ring placing area extends in a circumferential direction around the central axis of the electrostatic chuck 20 to surround the substrate placing area. An edge ring ER is mounted on the upper surface of the edge ring placing area. The edge ring ER has a substantially plate shape and a ring shape. The edge ring ER is placed on the edge ring placing area such that the central axis thereof coincides with the axis AX. The substrate W is disposed in an area surrounded by the edge ring ER. That is, the edge ring ER is disposed to surround the edge of the substrate W. The edge ring ER may have electrical conductivity. The edge ring ER is formed of, for example, silicon or silicon carbide.

The plasma processing apparatus 1A may further include a gas supply line 25. The gas supply line 25 supplies the heat transfer gas, for example, He gas, from a gas supply mechanism to a gap between the upper surface of the electrostatic chuck 20 and the back surface (lower surface) of the substrate W.

The plasma processing apparatus 1A may further include an insulating region 27. The insulating region 27 extends in the circumferential direction outside the substrate support 16 in the radial direction to surround the substrate support 16. The insulating region 27 may extend in the circumferential direction outside the support 17 in the radial direction to surround the support 17. The insulating region 27 is formed of an insulating material such as quartz. The edge ring ER is placed on the insulating region 27 and the edge ring placing area of the electrostatic chuck 20.

The plasma processing apparatus 1A further includes an upper electrode 30. The upper electrode 30 is provided above the substrate support 16. The upper electrode 30 closes an upper opening of the chamber body 12 together with a member 32. The member 32 has insulation properties. The upper electrode 30 is supported on the upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (vertical direction). The ceiling plate 34 is formed of, for example, silicon. However, there is no limitation thereto. Alternatively, the ceiling plate 34 may have a structure in which a plasma-resistant film is provided on the surface of a member made of aluminum. This film may be a ceramic film such as a film formed by anodization or a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. The support 36 has a gas introduction port 36c formed therein. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1A can supply the gas from one or more gas sources selected from the plurality of gas sources of the gas source group 40 to the internal space 10s at a flow rate individually adjusted.

A baffle plate 48 is provided between the substrate support 16 or the support 17 and the side wall of the chamber 10. The baffle plate 48 may be configured, for example, by coating a plate material made of aluminum with ceramic such as yttrium oxide. The baffle plate 48 has a plurality of through-holes. An exhaust pipe 52 is connected to the bottom portion of the chamber 10 below the baffle plate 48. An exhaust device 50 is connected to the exhaust pipe 52. The exhaust device 50 has a pressure controller such as an automatic pressure control valve, and a vacuum pump such as a turbo molecular pump, and can reduce the pressure in the internal space 10s.

The plasma processing apparatus 1A further includes a radio frequency power source 61. The radio frequency power source 61 is a power source that generates radio frequency power HF. The radio frequency power HF is used to generate plasma from the gas in the chamber 10. The radio frequency power HF has a first frequency. The first frequency is a frequency within the range of 27 to 100 MHz, for example 40 MHz or 60 MHz. The radio frequency power source 61 is connected to the lower electrode 18 through a matching circuit 63 in order to supply the radio frequency power HF to the lower electrode 18. The matching circuit 63 is configured to match the impedance on the load side (the lower electrode 18 side) with the output impedance of the radio frequency power source 61. In the embodiment in which the radio frequency power source 61 is electrically connected to the lower electrode 18, the upper electrode 30 is electrically grounded.

The plasma processing apparatus 1A further includes a bias power source 62. The bias power source 62 is configured to supply a bias BE to the lower electrode 18 when plasma is being generated in the chamber 10 for plasma processing on the substrate W. The bias power source 62 is electrically connected to the lower electrode 18 through a matching circuit 64. The matching circuit 64 is configured to match the impedance on the load side (the lower electrode 18 side) with the output impedance of the bias power source 62.

The bias BE is used to attract ions to the substrate W. The bias BE has a second frequency. The bias BE is set to change the potential of the substrate W placed on the electrostatic chuck 20 within a cycle which is defined by the second frequency. The second frequency is lower than the first frequency. The second frequency is a frequency within the range of 50 kHz to 27 MHz, for example.

Figure 3A:
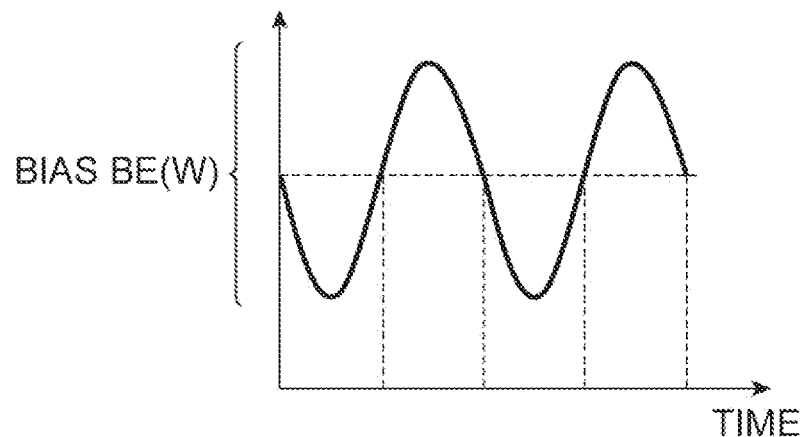
FIG. 3A is a diagram showing an example of a bias.
Figure 4:
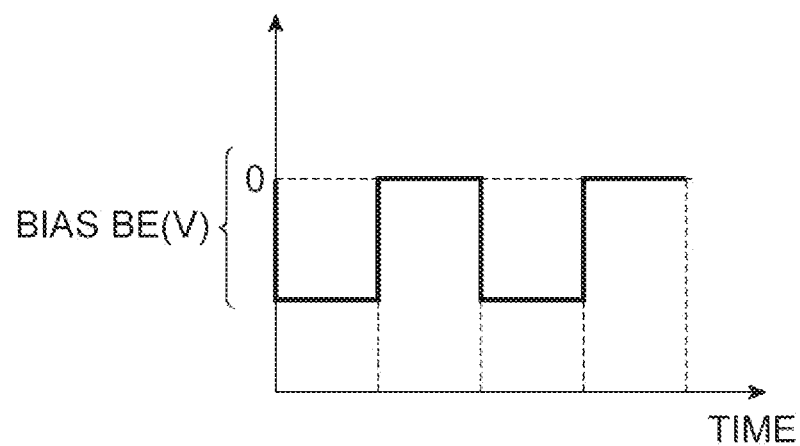
FIG. 4 is a diagram showing another example of the bias.

FIG. 3A is a diagram showing an example of the bias. As shown in FIG. 3A, the bias BE may be radio frequency bias power having the second frequency. FIG. 4 is a diagram showing another example of the bias. As shown in FIG. 4, the bias BE may be a pulsed negative voltage which is periodically applied to the lower electrode 18 at the second frequency.

The plasma processing apparatus 1A further includes a power source device 70. The power source device 70 is configured to apply a positive voltage to a conductive member. The conductive member extends closer to the side wall of the chamber 10 than the substrate W placed on the substrate support 16. In an embodiment, the conductive member is the edge ring ER.

Figure 3B:
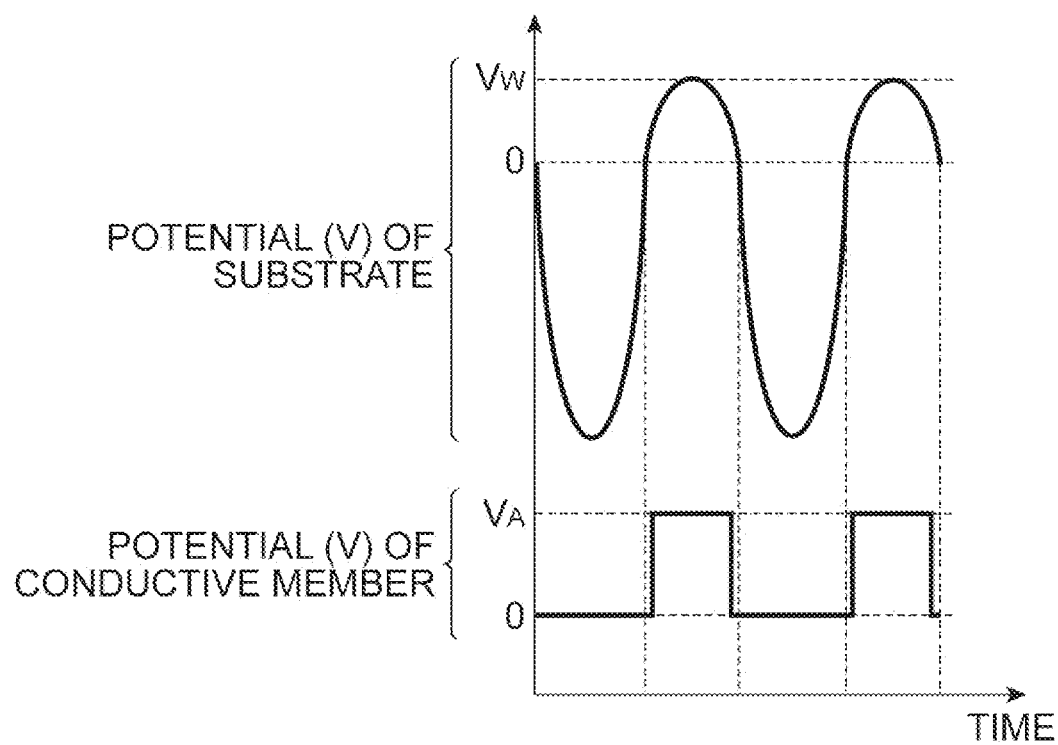
FIG. 3B is a timing chart showing an example of a potential of a substrate and a potential of a conductive member.

FIG. 3B is a timing chart showing an example of the potential of the substrate and the potential of the conductive member. As shown in FIG. 3B, when the bias BE is supplied to the lower electrode 18, the potential of the substrate W changes within the cycle which is defined by the second frequency. That is, the cycle which is defined by the second frequency includes a period in which the potential of the substrate W is negative and a period in which the potential of the substrate W is equal to or greater than 0. The period in which the potential of the substrate W is negative and the period in which the potential of the substrate W is positive are alternately repeated.

The power source device 70 is configured to apply a positive voltage to the edge ring ER in the period in which the potential of the substrate W is equal to or greater than 0, and set the potential of the edge ring ER in the period to a potential $V_A$ ($>V_W$) higher than a potential $V_W$ of the substrate W. In an embodiment, the power source device 70 includes a direct-current power source 70a and a switch 70b. The direct-current power source 70a may be a variable direct-current power source. The direct-current power source 70a is connected to the edge ring ER through the switch 70b. When the switch 70b is in a conduction state, the voltage from the direct-current power source 70a is applied to the edge ring ER. The level of the positive voltage which is applied to the edge ring ER and the application period of the positive voltage to the edge ring ER are specified by a controller MC. The level of the positive voltage which is applied to the edge ring ER and the application period of the positive voltage to the edge ring ER may be determined in advance.

The plasma processing apparatus 1A further includes the controller MC. The controller MC is a computer which includes a processor, a storage device, an input device, a display device, and the like, and controls each part of the plasma processing apparatus 1A. The controller MC executes a control program stored in the storage device, and controls each part of the plasma processing apparatus 1A, based on recipe data stored in the storage device. The process designated by the recipe data is executed in the plasma processing apparatus 1A under the control by the controller MC. In a case where the plasma processing apparatus 1A is used, the method MT may be executed by the control of each part of the plasma processing apparatus 1A by the controller MC.

Step ST2 is executed in a state where plasma is generated in the chamber 10. In order to generate the plasma, a gas is supplied from the gas supply unit into the chamber 10. Further, the exhaust device 50 operates to set the pressure in the chamber 10 to a designated pressure. Further, the radio frequency power HF is supplied. As a result, the gas in the chamber 10 is excited, so that plasma is generated from the gas. Step STb is executed in a state where the plasma is generated in this manner. In step STb, the bias BE is supplied from the bias power source 62 to the lower electrode 18. As a result, as shown in FIG. 3B, the potential of the substrate W changes periodically. In a case where the plasma processing apparatus 1A is used, in step ST2, a positive voltage is applied from the power source device 70 to the edge ring ER. Specifically, a positive voltage is applied to the edge ring ER in the period in which the potential of the substrate W is equal to or greater than 0. The positive voltage sets the potential $V_A$ of the edge ring ER to a potential higher than the potential $V_W$ of the substrate W in the period in which the potential of the substrate W is equal to or greater than 0.

Figure 5:
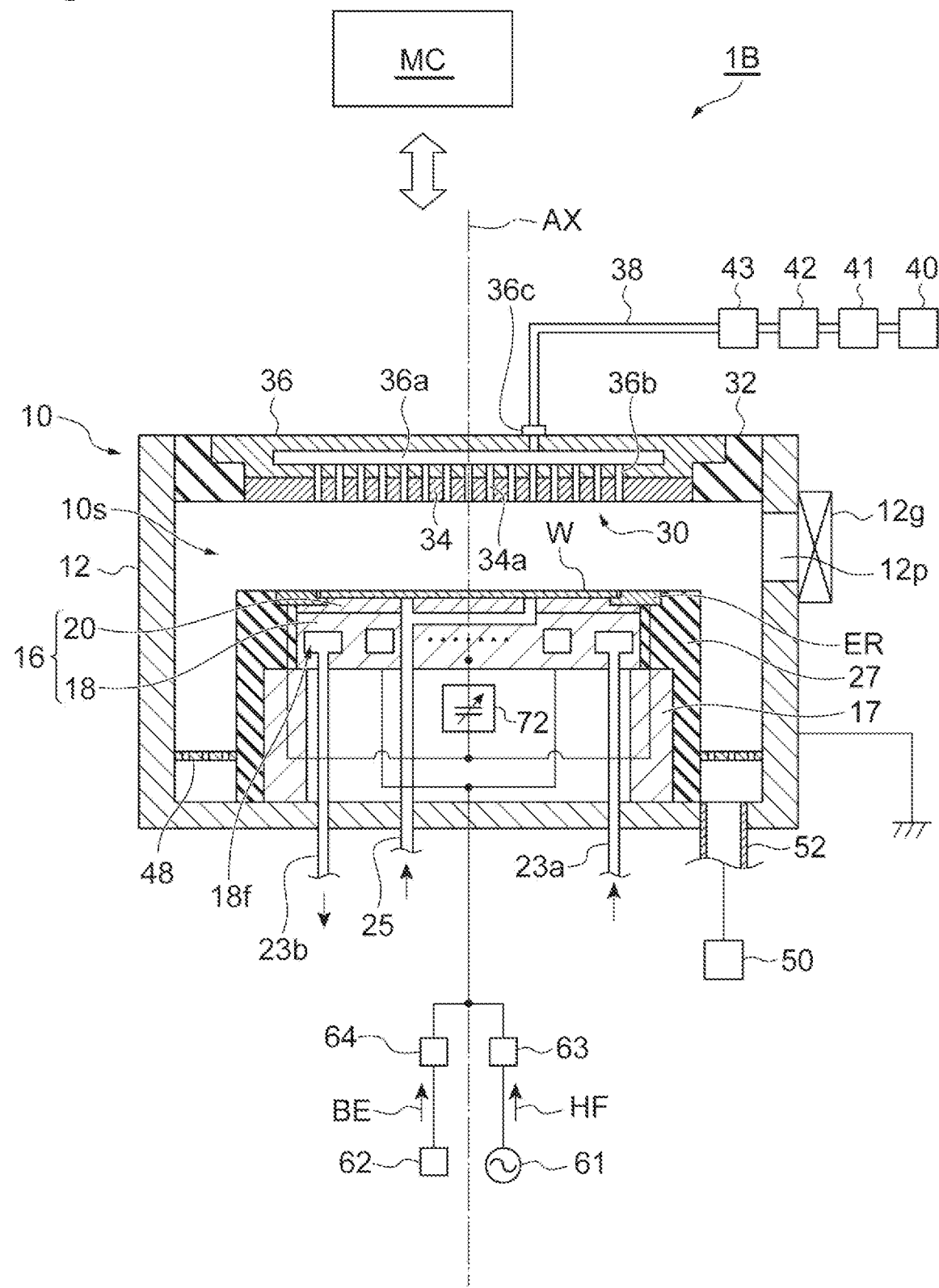
FIG. 5 is a diagram schematically showing a plasma processing apparatus according to another exemplary embodiment.

Hereinafter, FIG. 5 will be referred to. FIG. 5 is a diagram schematically showing a plasma processing apparatus according to another exemplary embodiment. Hereinafter, a plasma processing apparatus 1B shown in FIG. 5 will be described with respect to points different from the plasma processing apparatus 1A. The plasma processing apparatus 1B does not have the power source device 70. In the plasma processing apparatus 1B, the bias power source 62 also serves as a power source device that applies a voltage to the edge ring ER. In the plasma processing apparatus 1B, the bias power source 62 supplies radio frequency bias power to the lower electrode 18. The lower electrode 18 is connected to the edge ring ER through a variable impedance circuit 72. The variable impedance circuit 72 may include, for example, a variable capacitance capacitor.

In the plasma processing apparatus 1B, the radio frequency bias power which is supplied to the lower electrode 18 is branched into a first path from the lower electrode 18 to the substrate W through the electrostatic chuck 20 and a second path from the lower electrode 18 to the edge ring ER through the variable impedance circuit 72. Therefore, in the period in which the potential of the substrate W is equal to or greater than 0, the voltage which is applied to the edge ring ER can also have a positive polarity. Further, in the plasma processing apparatus 1B, the distribution ratio of the radio frequency bias power between the first path and the second path is adjusted by adjusting the impedance of the variable impedance circuit 72. The impedance of the variable impedance circuit 72 is set such that the potential $V_A$ of the edge ring ER becomes higher than the potential $V_W$ of the substrate W within the period in which the potential of the substrate W is equal to or greater than 0. The impedance of the variable impedance circuit 72 can be designated by the controller MC. The impedance of the variable impedance circuit 72 may be set in advance.

Figure 6:
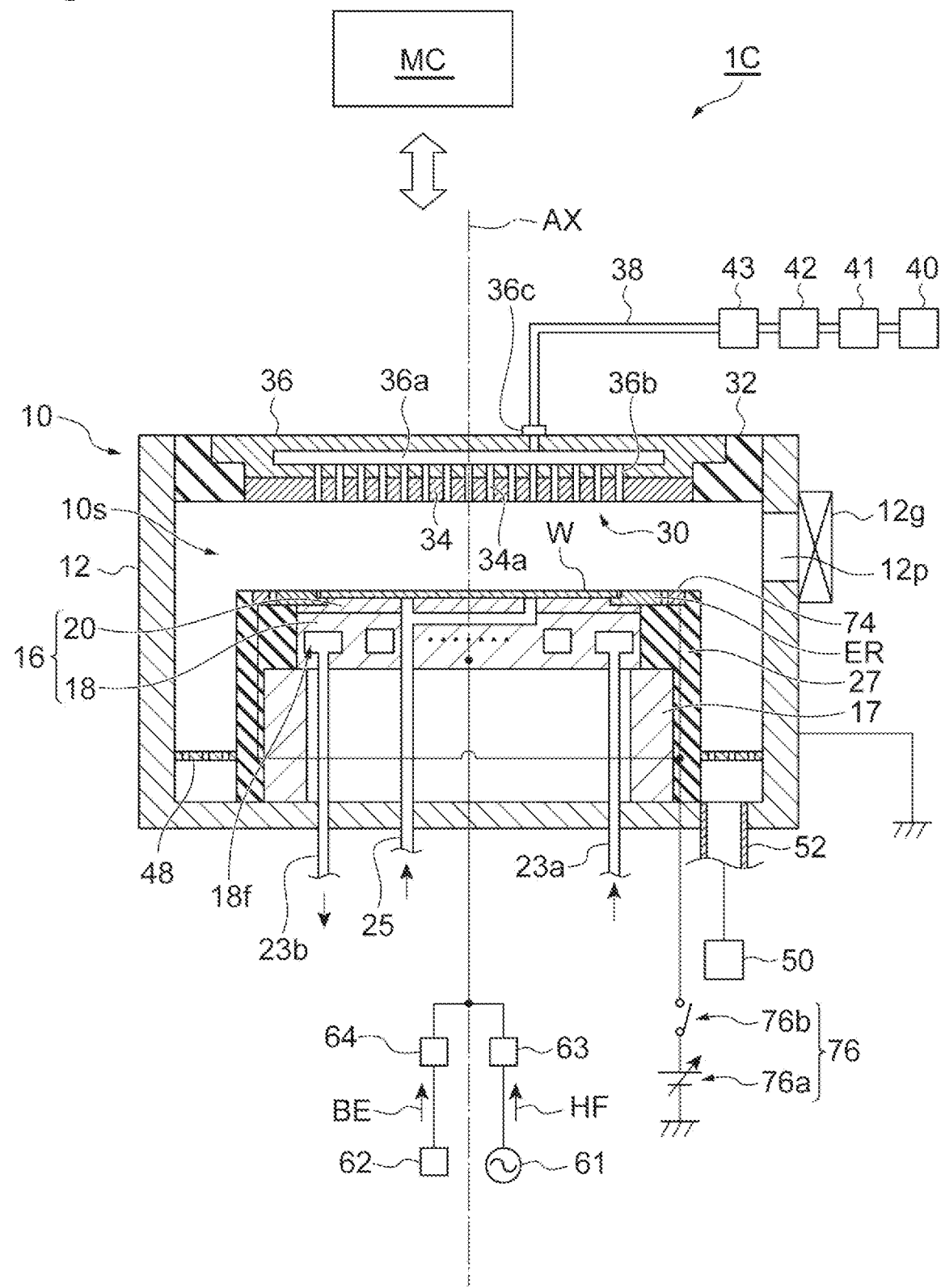
FIG. 6 is a diagram schematically showing a plasma processing apparatus according to still another exemplary embodiment.

Hereinafter, FIG. 6 will be referred to. FIG. 6 is a diagram schematically showing a plasma processing apparatus according to still another exemplary embodiment. Hereinafter, a plasma processing apparatus 1C shown in FIG. 6 will be described with respect to points different from the plasma processing apparatus 1A. The plasma processing apparatus 1C further includes a conductive member 74. The conductive member 74 is a member separate from the edge ring ER. The conductive member 74 is formed of a material having electrical conductivity, such as silicon. The conductive member 74 has a ring shape. The conductive member 74 extends closer to the side wall of the chamber 10 than the substrate W placed on the substrate support 16. Specifically, the conductive member 74 extends in the circumferential direction outside the edge ring ER in the radial direction. The conductive member 74 is mounted on the insulating region 27. In the plasma processing apparatus 1C, the position in the height direction of the upper surface of the conductive member 74 and the position in the height direction of the upper surface of the edge ring ER are substantially the same. The conductive member 74 is separated from the edge ring ER. That is, the conductive member 74 is electrically separated from the edge ring ER.

Figure 7:
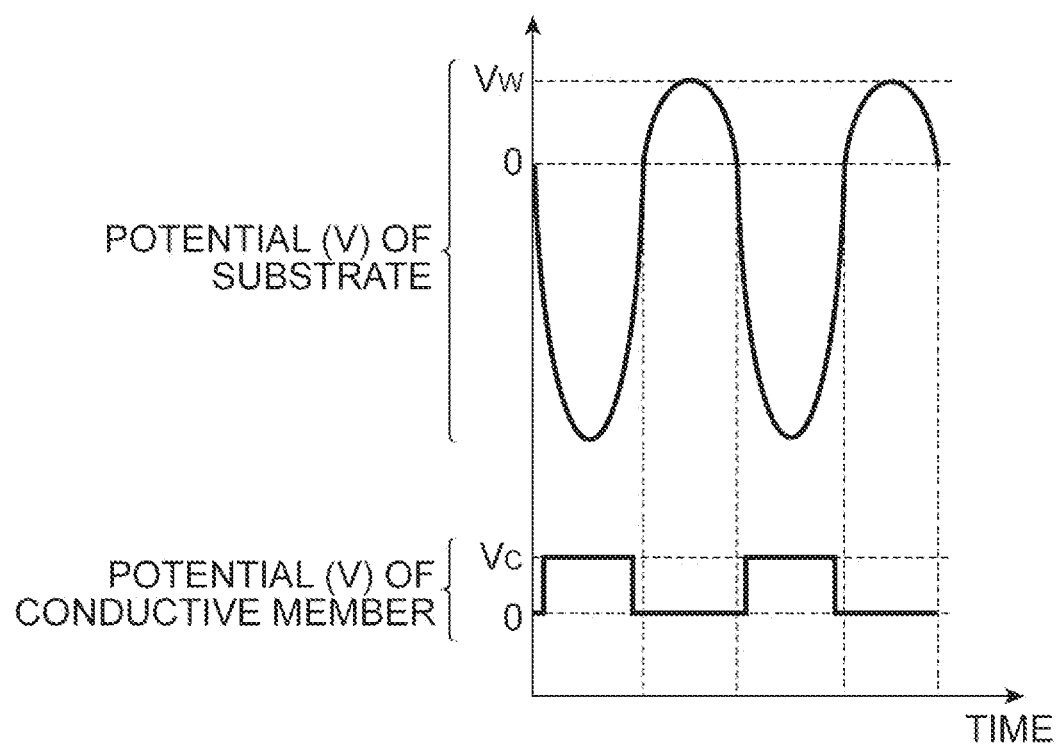
FIG. 7 is a timing chart showing an example of the potential of the substrate and the potential of the conductive member.

The plasma processing apparatus 1C includes a power source device 76 instead of the power source device 70. The power source device 76 is configured to apply a positive voltage to the conductive member 74. FIG. 7 is a timing chart showing an example of the potential of the substrate and the potential of the conductive member. The power source device 76 is configured to apply a positive voltage to the conductive member 74 in the period in which the potential of the substrate W is negative. Therefore, in the period in which the potential of the substrate W is negative, the potential of the conductive member 74 becomes a positive potential $V_C$. In an embodiment, the power source device 76 includes a direct-current power source 76a and a switch 76b. The direct-current power source 76a may be a variable direct-current power source. The direct-current power source 76a is connected to the conductive member 74 through the switch 76b. When the switch 76b is in a conduction state, the voltage from the direct-current power source 76a is applied to the conductive member 74. The level of the positive voltage which is applied to the conductive member 74 and the application period of the positive voltage to the conductive member 74 are specified by the controller MC. The level of the positive voltage which is applied to the conductive member 74 and the application period of the positive voltage to the conductive member 74 may be determined in advance.

As described above, step STb and step ST2 are executed in a state where plasma is generated in the chamber 10. In step STb, the bias BE is supplied from the bias power source 62 to the lower electrode 18. As a result, as shown in FIG. 7, the potential of the substrate W changes periodically. In a case where the plasma processing apparatus 1C is used, in step ST2, a positive voltage is applied from the power source device 76 to the conductive member 74. Specifically, a positive voltage is applied to the conductive member 74 in the period in which the potential of the substrate W is negative.

Figure 8:
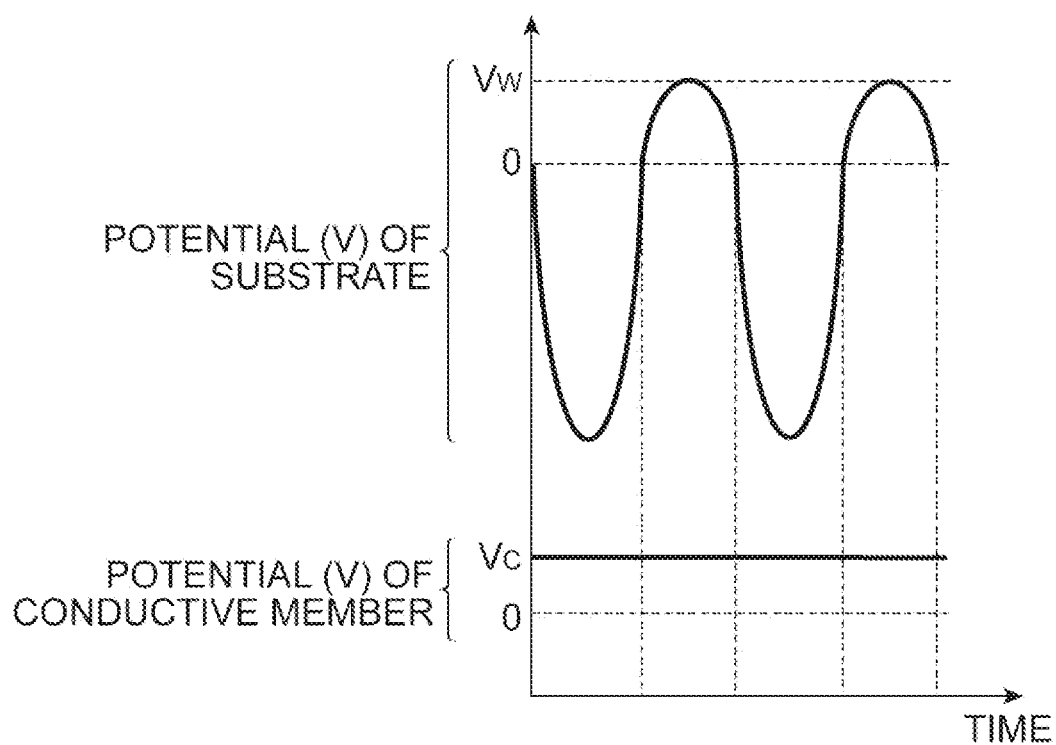
FIG. 8 is a timing chart showing another example of the potential of the substrate and the potential of the conductive member.

FIG. 8 is a timing chart showing another example of the potential of the substrate and the potential of the conductive member. As shown in FIG. 8, in an embodiment, the power source device 76 of the plasma processing apparatus 1C may apply a positive voltage to the conductive member 74 in both the period in which the potential of the substrate W is negative and the period in which the potential of the substrate W is equal to or greater than 0. In the execution of step ST2, the power source device 76 of the plasma processing apparatus 1C may continuously apply, for example, a positive direct-current voltage to the conductive member 74 in both the period in which the potential of the substrate W is negative and the period in which the potential of the substrate W is equal to or greater than 0.

Figure 9:
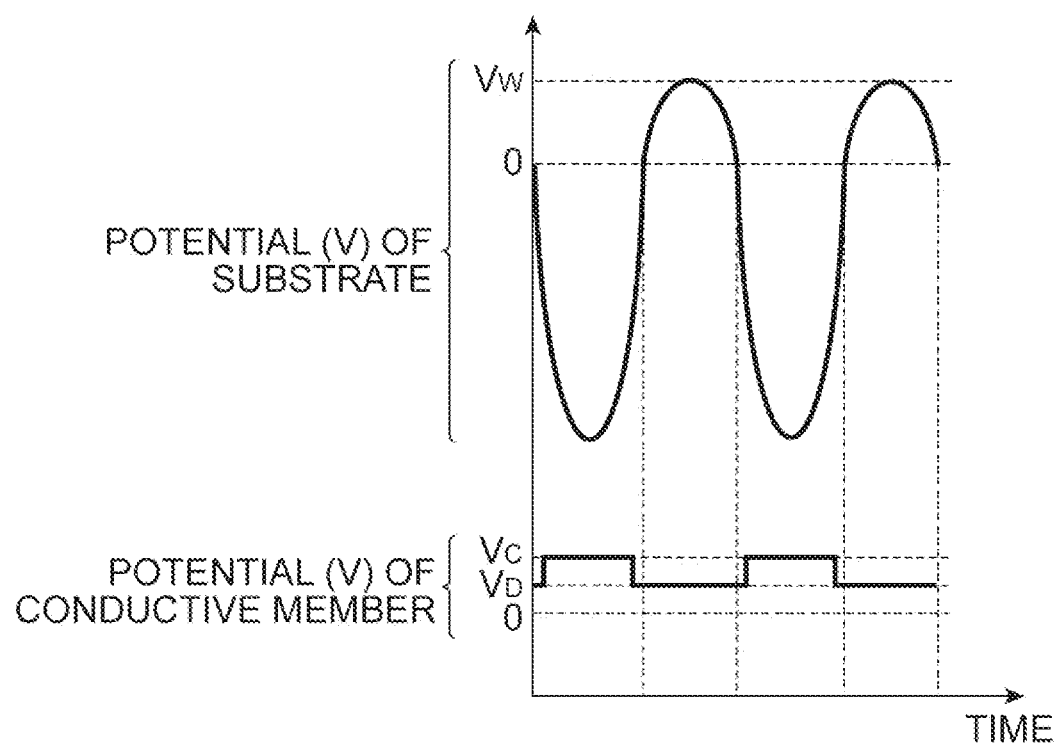
FIG. 9 is a timing chart showing still another example of the potential of the substrate and the potential of the conductive member.

FIG. 9 is a timing chart showing still another example of the potential of the substrate and the potential of the conductive member. As shown in FIG. 9, in an embodiment, the power source device 76 of the plasma processing apparatus 1C may apply a positive voltage higher than the positive voltage which is applied to the conductive member 74 within the period in which the potential of the substrate W is equal to or greater than 0, to the conductive member 74 within the period in which the potential of the substrate W is negative. In this example, the positive potential $V_C$ of the conductive member 74 within the period in which the potential of the substrate W is negative becomes higher than a positive potential $V_D$ of the conductive member 74 within the period in which the potential of the substrate W is equal to or greater than 0.

Figure 10:
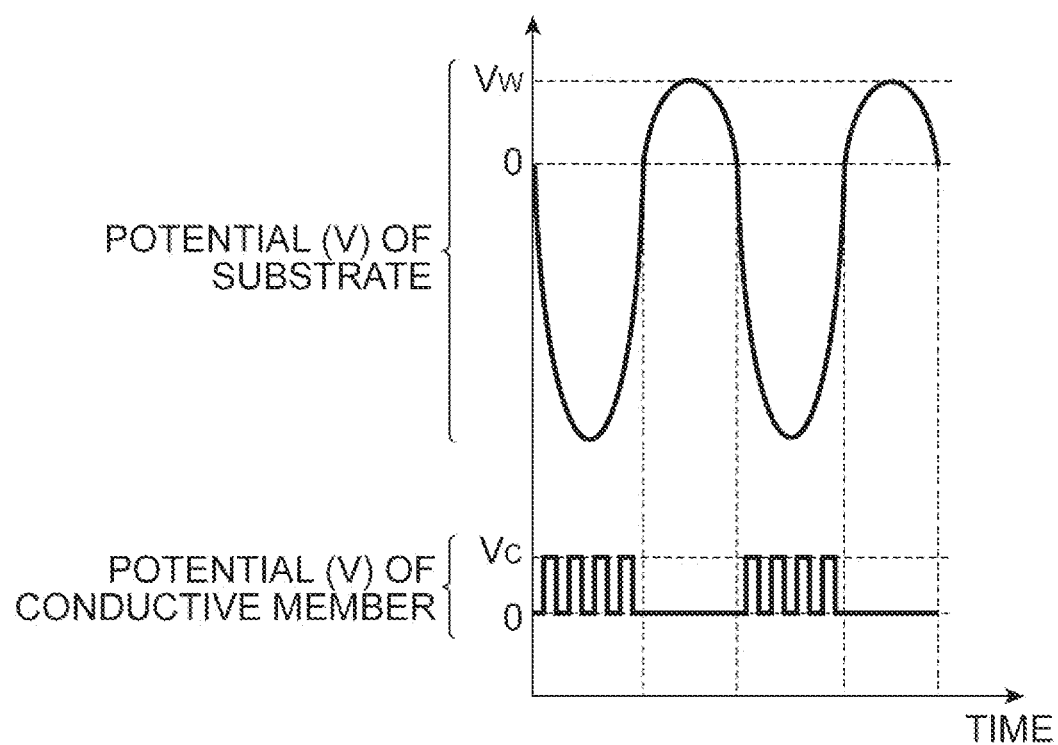
FIG. 10 is a timing chart showing still another example of the potential of the substrate and the potential of the conductive member.

FIG. 10 is a timing chart showing still another example of the potential of the substrate and the potential of the conductive member. As shown in FIG. 10, in an embodiment, the power source device 76 of the plasma processing apparatus 1C may periodically or intermittently apply a pulsed positive voltage to the conductive member 74 within the period in which the potential of the substrate W is negative.

Figure 11:
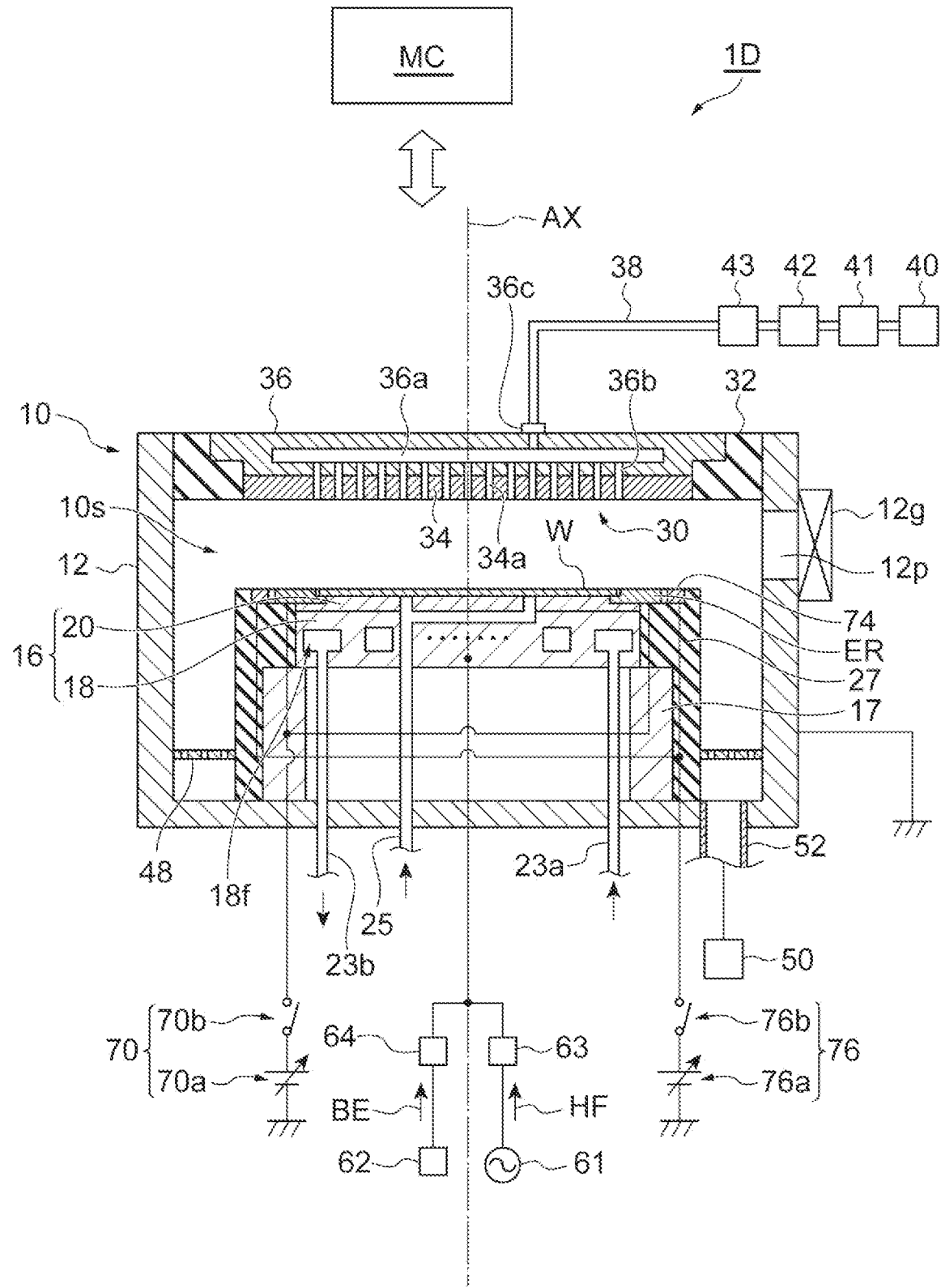
FIG. 11 is a diagram schematically showing a plasma processing apparatus according to still another exemplary embodiment.

Hereinafter, FIG. 11 will be referred to. FIG. 11 is a diagram schematically showing a plasma processing apparatus according to still another exemplary embodiment. Hereinafter, a plasma processing apparatus 1D shown in FIG. 11 will be described with respect to points different from the plasma processing apparatus 1C. The plasma processing apparatus 1D further includes a power source device 70 as another power source device. The power source device 70 has the same configuration as the power source device 70 of the plasma processing apparatus 1A. Specifically, the power source device 70 of the plasma processing apparatus 1D applies a positive voltage to the edge ring ER in the period in which the potential of the substrate W is equal to or greater than 0, and sets the potential $V_A$ of the edge ring ER to a potential higher than the potential $V_W$ of the substrate W in the period.

Figure 12:
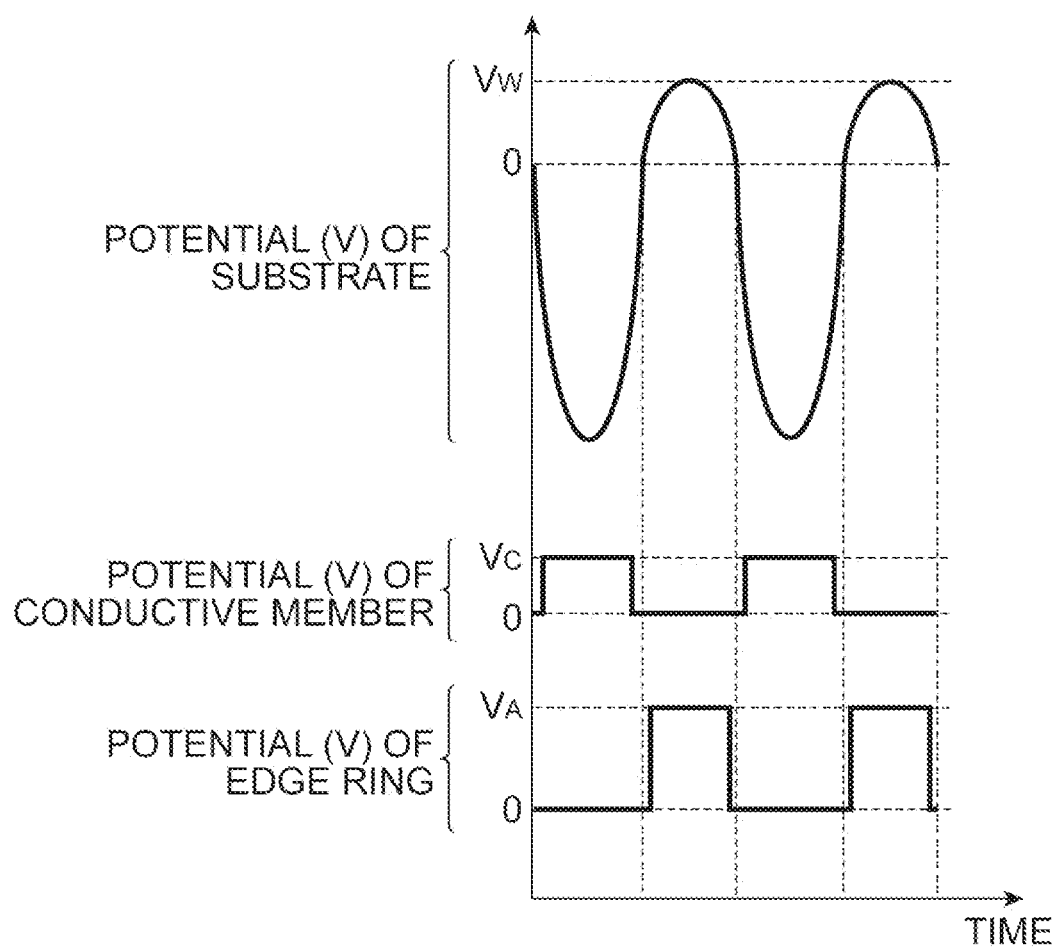
FIG. 12 is a timing chart showing an example of a potential of a substrate, a potential of a conductive member, and a potential of an edge ring.

FIG. 12 is a timing chart showing an example of the potential of the substrate, the potential of the conductive member, and the potential of the edge ring. In a case where the method MT is executed by using the plasma processing apparatus 1D, as shown in FIG. 12, in step ST2, a positive voltage is applied from the power source device 76 to the conductive member 74. Even in a case where the plasma processing apparatus 1D is used, the positive voltage from the power source device 76 is applied to the conductive member 74, similarly to the positive voltage described with reference to FIGS. 7 to 10. That is, the positive voltage from the power source device 76 is applied to the conductive member 74 within at least the period in which the potential of the substrate W is negative. As a result, the potential of the conductive member 74 becomes the positive potential $V_C$ within the period in which the potential of the substrate W is negative. Further, in a case where the plasma processing apparatus 1D is used, in step ST2, the positive voltage from the power source device 70 is applied to the edge ring ER. The positive voltage from the power source device 70 is applied to the edge ring ER in the period in which the potential of the substrate W is equal to or greater than 0. The positive voltage which is applied to the edge ring ER sets the potential $V_A$ of the edge ring ER to a potential higher than the potential $V_W$ of the substrate W in the period in which the potential of the substrate W is equal to or greater than 0.

Figure 13:
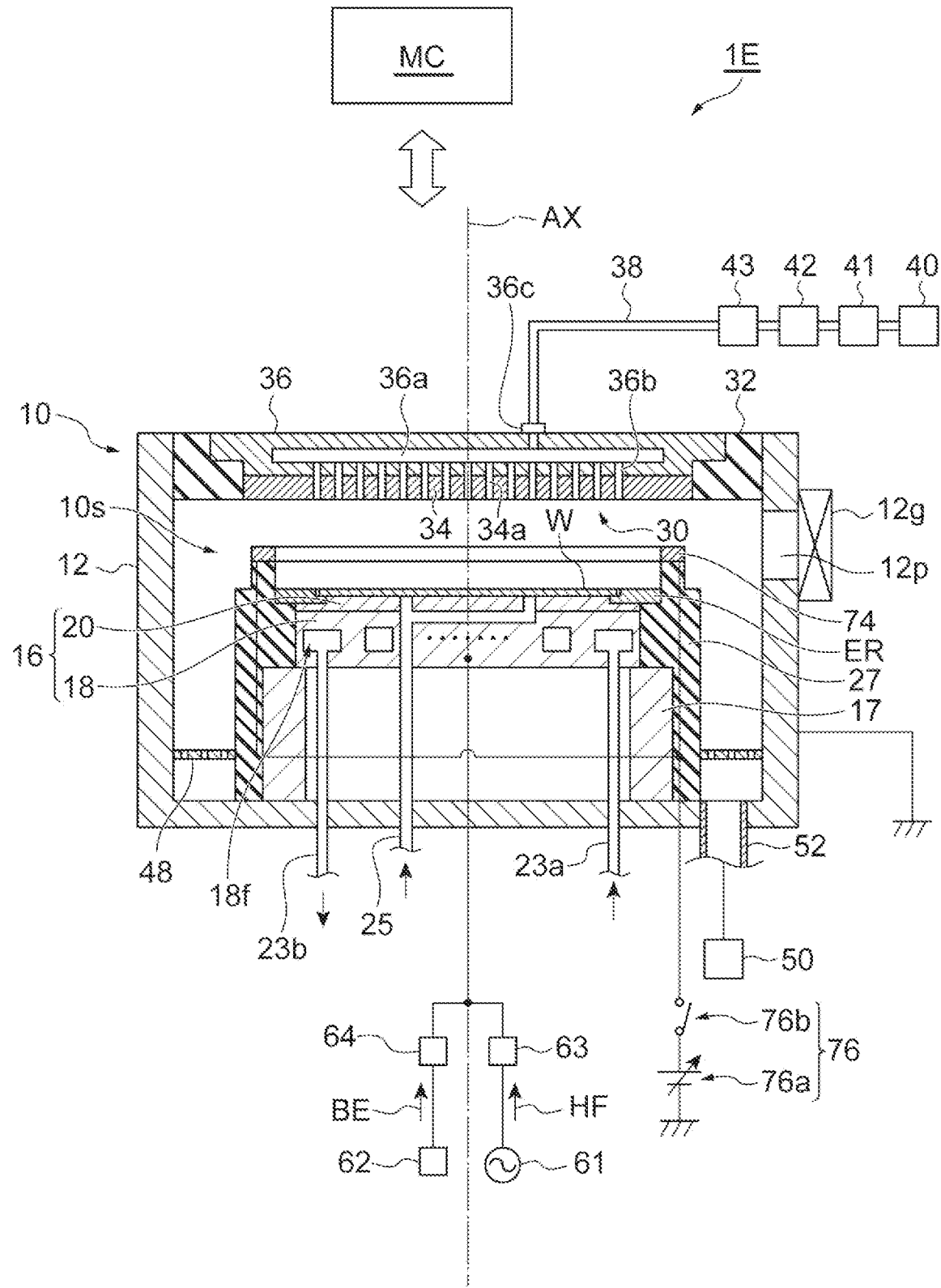
FIG. 13 is a diagram schematically showing a plasma processing apparatus according to still another exemplary embodiment.

Hereinafter, FIG. 13 will be referred to. FIG. 13 is a diagram schematically showing a plasma processing apparatus according to still another exemplary embodiment. Hereinafter, a plasma processing apparatus 1E shown in FIG. 13 will be described with respect to points different from the plasma processing apparatus 1C. In the plasma processing apparatus 1E, the insulating region 27 has a raised portion raised upward with respect to the edge ring ER outside the edge ring ER in the radial direction. The conductive member 74 is mounted on the raised portion. Therefore, the position in the height direction of the conductive member 74 is higher than the position in the height direction of the edge ring ER and the position in the height direction of the substrate W.

Figure 14:
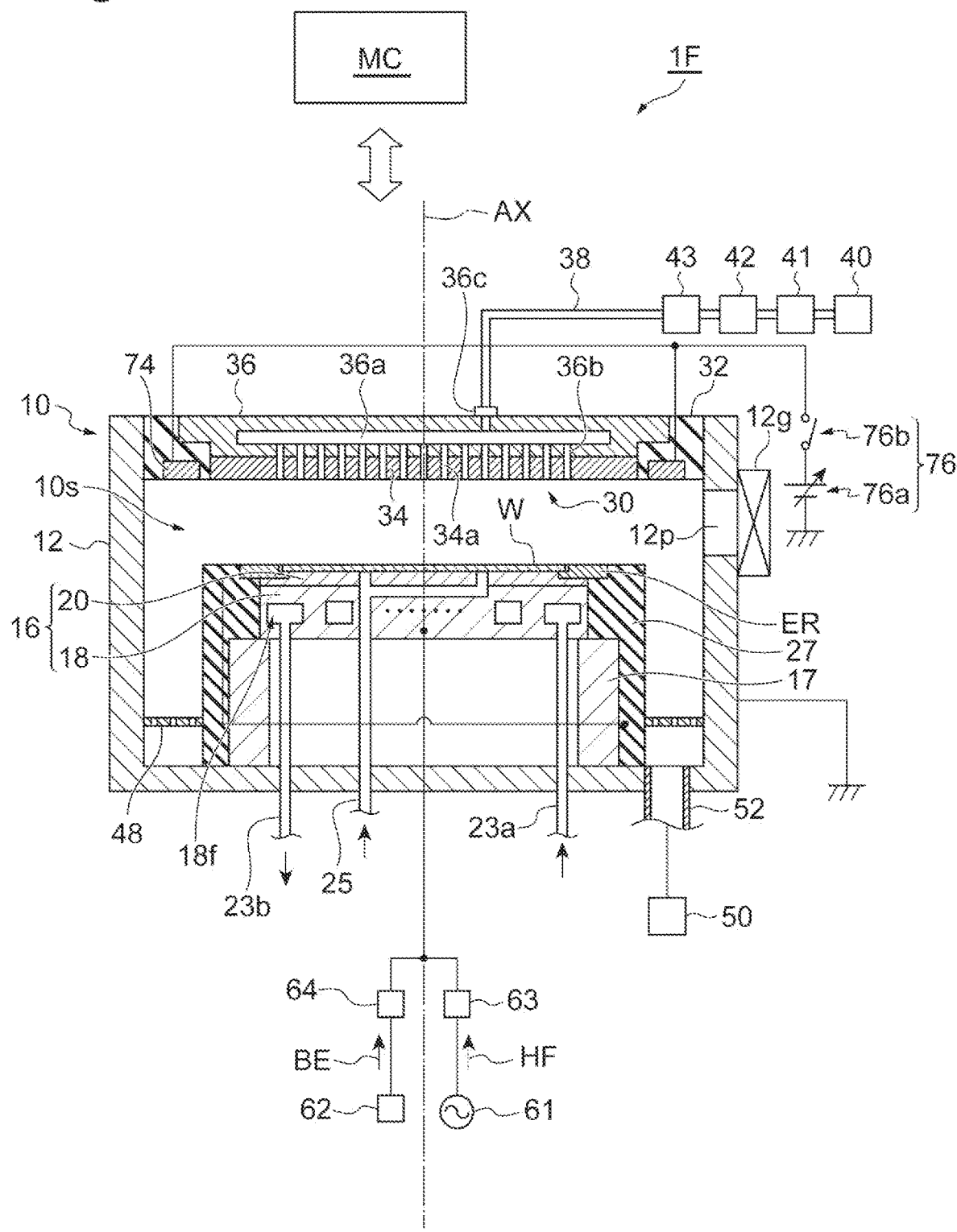
FIG. 14 is a diagram schematically showing a plasma processing apparatus according to still another exemplary embodiment.

Hereinafter, FIG. 14 will be referred to. FIG. 14 is a diagram schematically showing a plasma processing apparatus according to still another exemplary embodiment. Hereinafter, a plasma processing apparatus 1F shown in FIG. 14 will be described with respect to points different from the plasma processing apparatus 1C. In the plasma processing apparatus 1F, the conductive member 74 extends in the circumferential direction outside the upper electrode 30 in the radial direction. The conductive member 74 is embedded in the member 32. The member 32 extends between the upper electrode 30 and the side wall of the chamber 10.

Each of the plasma processing apparatus 1E and the plasma processing apparatus 1F may have the power source device 70 as another power source device, similarly to the plasma processing apparatus 1D. The power source device 70 applies a positive voltage to the edge ring ER in the period in which the potential of the substrate W is equal to or greater than 0, and sets the potential $V_A$ of the edge ring ER to a potential higher than the potential $V_W$ of the substrate W.

While various exemplary embodiments have been described above, various additions, omissions, substitutions and changes may be made without being limited to the exemplary embodiments described above. Elements of the different embodiments may be combined to form another embodiment.

For example, the radio frequency power source 61 may not be connected to the lower electrode 18 and may be connected to the upper electrode 30 through the matching circuit 63. Further, in another embodiment, the plasma processing apparatus may be any type of plasma processing apparatus such as an inductively-coupled plasma processing apparatus, as long as a positive voltage can be applied to the edge ring ER and/or the conductive member 74, as described above. Further, as the positive voltage which is applied to the edge ring ER and/or the conductive member 74 when plasma is being generated, the pulsed or continuous positive direct-current voltage has been exemplified. However, the positive voltage is not particularly limited. For example, the positive voltage may be a voltage having any waveform such as a waveform which is obtained by combining a positive direct-current voltage with a triangular wave or the like. Further, when the plasma is not generated, a negative voltage may be applied to the edge ring ER and/or the conductive member 74.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A plasma processing apparatus comprising:
   a chamber;
   a substrate support disposed in the chamber, the substrate support including:
      a lower electrode; and a conductive ring disposed closer to a side wall of the chamber than a substrate placed on the substrate support;

an RF power source configured to generate an RF power having a first frequency to generate a plasma in the chamber;

a bias power source configured to supply a bias to the lower electrode, the bias being a bias RF power having a second frequency less than the first frequency or a pulsed negative voltage which is periodically applied to the lower electrode at the second frequency, a waveform cycle of the bias defined by the second frequency including a first period in which a potential of the substrate is negative and a second period in which a potential of the substrate is equal to or greater than 0, the second frequency being not less than 50 kHz and not more than 27 MHz;

a power source device configured to apply a voltage to the conductive ring; and a controller configured to control the power source device to apply a first voltage to the conductive ring in the first period in the waveform cycle and to apply a second voltage greater than the first voltage to the conductive ring in the second period in the waveform cycle, the second voltage having a positive polarity.

2. The plasma processing apparatus according to claim 1, wherein the first voltage has a zero voltage level.

3. The plasma processing apparatus according to claim 1, wherein the conductive ring is disposed so as to surround the substrate placed on the substrate support.

4. The plasma processing apparatus according to claim 1, wherein the substrate support includes an edge ring disposed between the substrate placed on the substrate support and the conductive ring.

5. The plasma processing apparatus according to claim 4, wherein the conductive ring is electrically separated from the edge ring.

6. A plasma processing apparatus comprising:
a chamber;
a substrate support disposed in the chamber, the substrate support including:
a lower electrode; and
a conductive ring disposed closer to a side wall of the chamber than a substrate placed on the substrate support;

an RF power source configured to generate an RF power having a first frequency to generate a plasma in the chamber;

a bias power source configured to periodically apply a pulsed voltage to the lower electrode at a second frequency, a waveform cycle of the pulsed voltage defined by the second frequency including a first period in which the substrate has a first potential and a second period in which the substrate has a second potential, the second frequency being not less than 50 kHz and not more than 27 MHz;

a power source device configured to apply a voltage to the conductive ring; and a controller configured to control the power source device to apply a first voltage to the conductive ring in the first period in the waveform cycle and to apply a second voltage greater than the first voltage to the conductive ring in the second period in the waveform cycle, the second voltage having a positive polarity.

7. The plasma processing apparatus according to claim 6, wherein the first voltage has a zero voltage level.

8. The plasma processing apparatus according to claim 6, wherein the pulsed voltage has a negative polarity, the first potential has a negative polarity.

9. The plasma processing apparatus according to claim 8, wherein the second potential is equal to 0.

10. The plasma processing apparatus according to claim 6, wherein the conductive ring is disposed so as to surround the substrate placed on the substrate support.

11. The plasma processing apparatus according to claim 6, wherein the substrate support includes an edge ring disposed between the substrate placed on the substrate support and the conductive ring.

12. The plasma processing apparatus according to claim 11, wherein the conductive ring is electrically separated from the edge ring.

* * * * *